US012812768B2

(12) United States Patent
Kawaji et al.

(10) Patent No.: US 12,812,768 B2
(45) Date of Patent: Nov. 24, 2026

(54) CIRCUIT BOARD

(71) Applicant: KYOCERA CORPORATION, Kyoto (JP)

(72) Inventors: Satoshi Kawaji, Yokohama (JP); Masamitsu Nishikido, Yokohama (JP); Youhei Murakami, Yokohama (JP); Masayuki Sato, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 125 days.

(21) Appl. No.: 18/691,889

(22) PCT Filed: Sep. 9, 2022

(86) PCT No.: PCT/JP2022/033961
§ 371 (c)(1),
(2) Date: Mar. 14, 2024

(87) PCT Pub. No.: WO2023/042770
PCT Pub. Date: Mar. 23, 2023

(65) Prior Publication Data

US 2024/0389221 A1 Nov. 21, 2024

(30) Foreign Application Priority Data

Sep. 17, 2021 (JP) ................................ 2021-152596

(51) Int. Cl.
*H05K 1/02* (2006.01)
*H01P 3/08* (2006.01)

(52) U.S. Cl.
CPC ............... *H05K 1/024* (2013.01); *H01P 3/08* (2013.01)

(58) Field of Classification Search
CPC .......... H05K 1/02; H05K 3/46; H05K 1/0225; H05K 2201/0191; H01P 3/08; H01P 3/082
USPC .......................................................... 174/250
See application file for complete search history.

(56) References Cited

U.S. PATENT DOCUMENTS

| | | | |
|---|---|---|---|
| 2008/0149376 | A1 | 6/2008 | Saito |
| 2016/0236402 | A1 | 8/2016 | Nakashima et al. |
| 2018/0270949 | A1 | 9/2018 | Fukumori |
| 2019/0023899 | A1 | 1/2019 | Tanigawa et al. |
| 2022/0105689 | A1 | 4/2022 | Nakashima et al. |

FOREIGN PATENT DOCUMENTS

| | | | |
|---|---|---|---|
| JP | 2005303778 | A | 10/2005 |
| JP | 2007096159 | A | 4/2007 |
| JP | 2008160750 | A | 7/2008 |
| JP | 2009141233 | A | 6/2009 |
| WO | 2015064437 | A1 | 5/2015 |

*Primary Examiner* — Tremesha W Burns
(74) *Attorney, Agent, or Firm* — HAUPTMAN HAM, LLP

(57) ABSTRACT

A circuit board includes a first conductor, a second conductor, a transmission line, a first dielectric layer, and a second dielectric layer. The transmission line is disposed between the first conductor and the second conductor. The first dielectric layer is disposed between the first conductor and the transmission line. The first dielectric layer includes at least one first dielectric. The second dielectric layer is disposed between the second conductor and the transmission line. The second dielectric layer includes at least one second dielectric. The second dielectric layer is thicker than the first dielectric layer. The permittivity and/or the dielectric dissipation factor of the first dielectric is smaller than the permittivity and/or the dielectric dissipation factor of the second dielectric.

3 Claims, 4 Drawing Sheets

CIRCUIT BOARD

CROSS-REFERENCE TO RELATED APPLICATIONS

This application is a National Phase of International Application Number PCT/JP2022/033961 filed Sep. 9, 2022, which claims priority to and the benefit of Japanese Patent Application No. 2021-152596 filed on Sep. 17, 2021, the entire disclosure of which is incorporated herein by reference.

TECHNICAL FIELD

The present invention relates to a circuit board.

BACKGROUND OF INVENTION

For example, an apparatus, such as a smartphone or a millimeter-wave radar, transmits and receives radio waves and incorporates various components such as an antenna and a circuit board. Such components transmit and receive radio waves. In such an apparatus, for example, a loss (dielectric loss) in an antenna feeder line or the like is desirably reduced. Several proposals have been made to reduce the loss in the antenna feeder line or the like.

For example, Patent Literature 1 discloses that, in a circuit board, an air space is physically provided in an insulating layer between a metal conductor and a power supply layer so as to reduce an effective relative permittivity. Patent Literature 2 discloses that, in a circuit board, a hollow space is provided between a center conductor and an electrode so as to reduce an effective relative permittivity. Patent Literature 3 discloses the disposition of a dielectric material between a pair of differential wires in an inner layer of a printed circuit board. Dielectric layers sandwich, from above and below, a layer including the differential wires. The dielectric material has a permittivity lower than those of the dielectric layers. Patent Literature 4 discloses that loss reduction is achieved by using a low-loss dielectric, in a circuit board, in a signal layer sandwiched between insulating layers, for the thin insulating layer side to concentrate an electric field generated by a signal onto the low-loss dielectric side.

CITATION LIST

Patent Literature

Patent Literature 1: Japanese Unexamined Patent Application Publication No. 2008-160750

Patent Literature 2: Japanese Unexamined Patent Application Publication No. 2005-303778

Patent Literature 3: Japanese Unexamined Patent Application Publication No. 2009-141233

Patent Literature 4: Japanese Unexamined Patent Application Publication No. 2007-96159

SUMMARY

In an embodiment, a circuit board includes a first conductor, a second conductor, a transmission line, a first dielectric layer, and a second dielectric layer.

The transmission line is disposed between the first conductor and the second conductor.

The first dielectric layer is disposed between the first conductor and the transmission line. The first dielectric layer includes at least one first dielectric.

The second dielectric layer is disposed between the second conductor and the transmission line. The second dielectric layer includes at least one second dielectric.

The second dielectric layer is thicker than the first dielectric layer.

The permittivity and/or the dielectric dissipation factor of the first dielectric is smaller than the permittivity and/or the dielectric dissipation factor of the second dielectric.

DESCRIPTION OF EMBODIMENTS

A loss in an antenna feeder line of a circuit board is desirably reduced. The reduced manufacturing cost of such a circuit board has an advantage. The present disclosure provides a circuit board enabling loss reduction and, at the same time, suppression of the manufacturing cost. According to an embodiment, a circuit board enabling loss reduction and, at the same time, suppression of the manufacturing cost can be provided. Hereinafter, an embodiment will be detailed with reference to the drawings.

Figure 1:
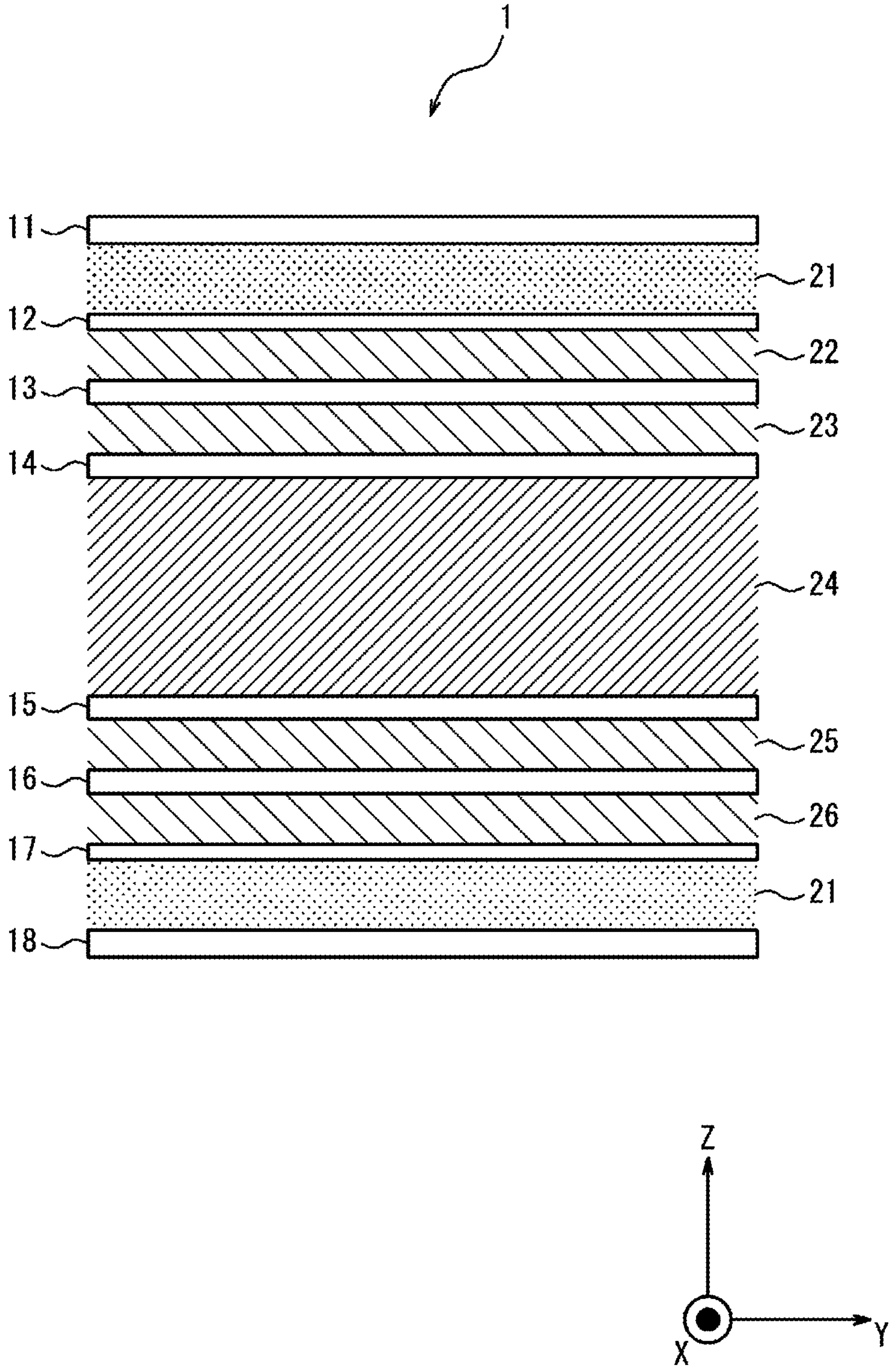
FIG. 1 illustrates a cross section, in a predetermined direction, of a circuit board according to an embodiment.

FIG. 1 is a schematic view of the overall configuration of a circuit board according to an embodiment. In an embodiment, the use of the circuit board is not particularly limited. For example, the circuit board may be used for an apparatus that transmits and receives radio waves, such as a smartphone or a millimeter-wave radar.

As FIG. 1 illustrates, in an embodiment, a circuit board 1 may be, for example, a hybrid multilayer board. FIG. 1 illustrates a cross section of the circuit board 1 according to an embodiment. The circuit board 1 illustrated in FIG. 1 has a structure multilayered in the Z-axis direction given in the figure. That is, the thickness direction of the circuit board 1 illustrated in FIG. 1 may be the Z-axis direction given in the figure. As will be described later, in an embodiment, a signal line (strip line) may be configured in the circuit board 1. The circuit board 1 illustrated in FIG. 1 may transmit a signal in the Y-axis direction given in the figure.

As FIG. 1 illustrates, in an embodiment, the circuit board 1 includes conductors 11 to 18. Each of the conductors 11 to 18 may contain, for example, copper. FIG. 1 illustrates an example of the circuit board 1, according to an embodiment, having an eight-layer structure of the conductors 11 to 18. However, in an embodiment, the structure of the circuit board 1 is not limited to the eight-layer structure and may be a multilayer structure of any number of layers.

As FIG. 1 illustrates, in an embodiment, the circuit board 1 includes dielectric layers 21 to 27. Each of the dielectric layers 21 to 27 may be disposed between corresponding conductors of the conductors 11 to 18. Each of the dielectric layers 21 to 27 may include any dielectric. In an embodiment, each of the dielectric layers 21 to 27 may be formed by using, for example, an FR-4 standard resin material.

Among the dielectric layers 21 to 27 illustrated in FIG. 1, the dielectric layer 21 and the dielectric layer 27 may be formed by using, for example, a base material having a relatively low permittivity and/or dielectric dissipation factor. That is, the permittivity and/or the dielectric dissipation factor of each of the dielectric layer 21 and the dielectric layer 27 may be lower than a predetermined value. The dielectric layer 21 and the dielectric layer 27 may be used for a millimeter wave band, for example. In the present disclosure, the dielectric loss of a transmission line can be expressed as a (transmission loss) in Equation (1) below. In Equation (1), K represents a proportionality constant, f represents a frequency, εr represents a relative permittivity, and tan δ represents a dielectric dissipation factor.

$$\alpha = K \times f \times \sqrt{\varepsilon r} \times \tan\delta \tag{1}$$

The dielectric loss of the transmission line, which is represented by α in Equation (1) above, is proportional to both the permittivity and the dielectric dissipation factor. Thus, in the circuit board 1 according to an embodiment, at least one of the permittivity and the dielectric dissipation factor of each of the dielectric layer 21 and the dielectric layer 27 may be reduced. In an example of a material used for an existing millimeter-wave radar, examples of the values of a low permittivity and a low dielectric dissipation factor include the following values. That is, for example, the permittivity Dk is 4.4 and the dielectric dissipation factor Df is 0.02 at 10 GHz in an FR-4 standard resin material, whereas the permittivity Dk may be 3.0 and the dielectric dissipation factor Df may be 0.001 at 10 GHz. However, the above values may vary depending on the material manufacturer, the model number, the frequency to be used, and/or the ambient temperature.

In the present disclosure, the permittivity may be a relative permittivity. The dielectric dissipation factor (tan δ) is a numerical value representing the degree of the electric energy loss (energy loss rate) in a dielectric. The dielectric dissipation factor (tan δ) can be expressed by Equation (2) below, where Ic represents a signal current, and Ir represents a loss current.

$$\tan\delta = Ir/Ic \tag{2}$$

As FIG. 1 illustrates, in the circuit board 1 according to an embodiment, the conductor 14 and the conductor 15 of copper plates may be pressed with the dielectric layer 24 as a core material. The dielectric layers 22, 23, 25, and 26 may each be a prepreg, for example.

Figure 2:
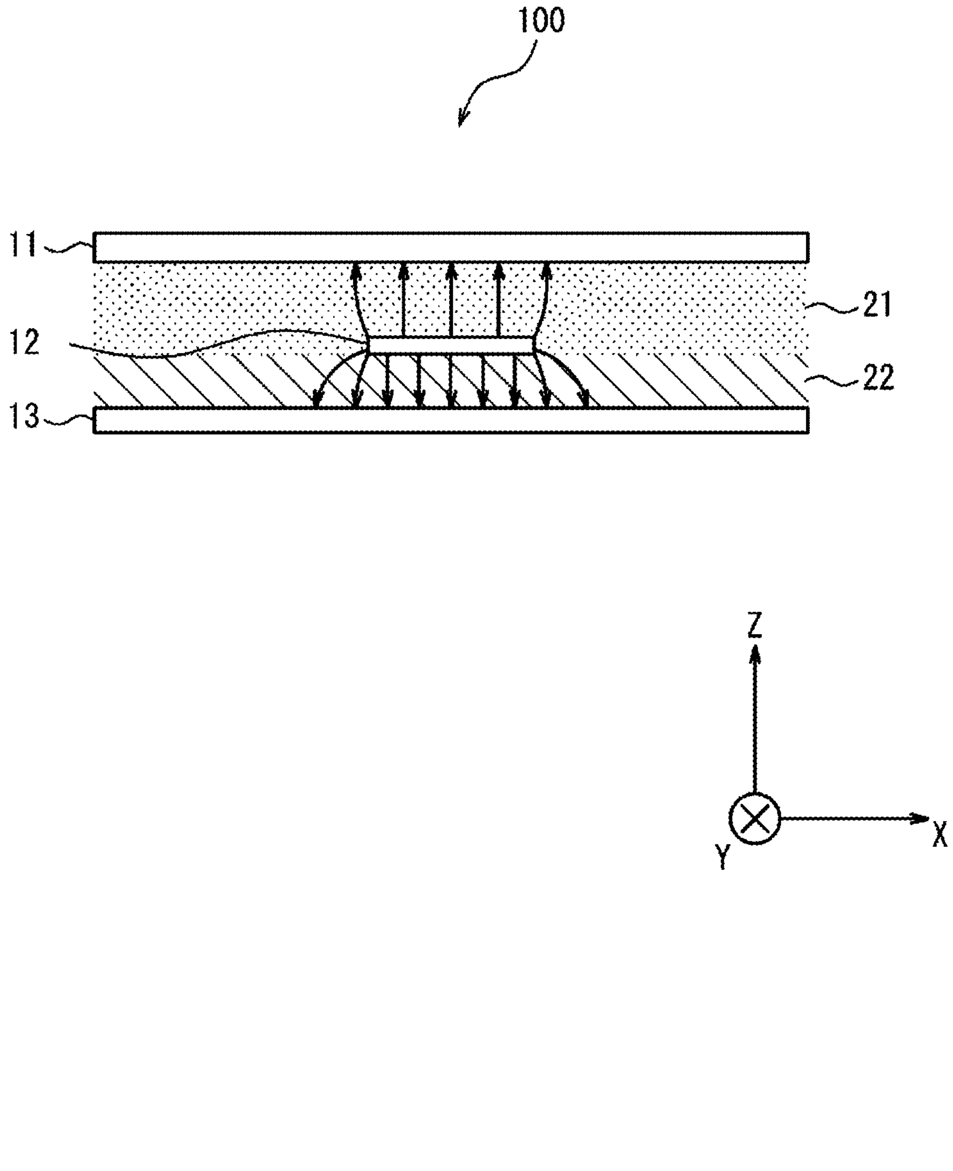
FIG. 2 illustrates a cross section, in a predetermined direction, of a comparative example given for explaining the circuit board according to an embodiment.
Figure 3:
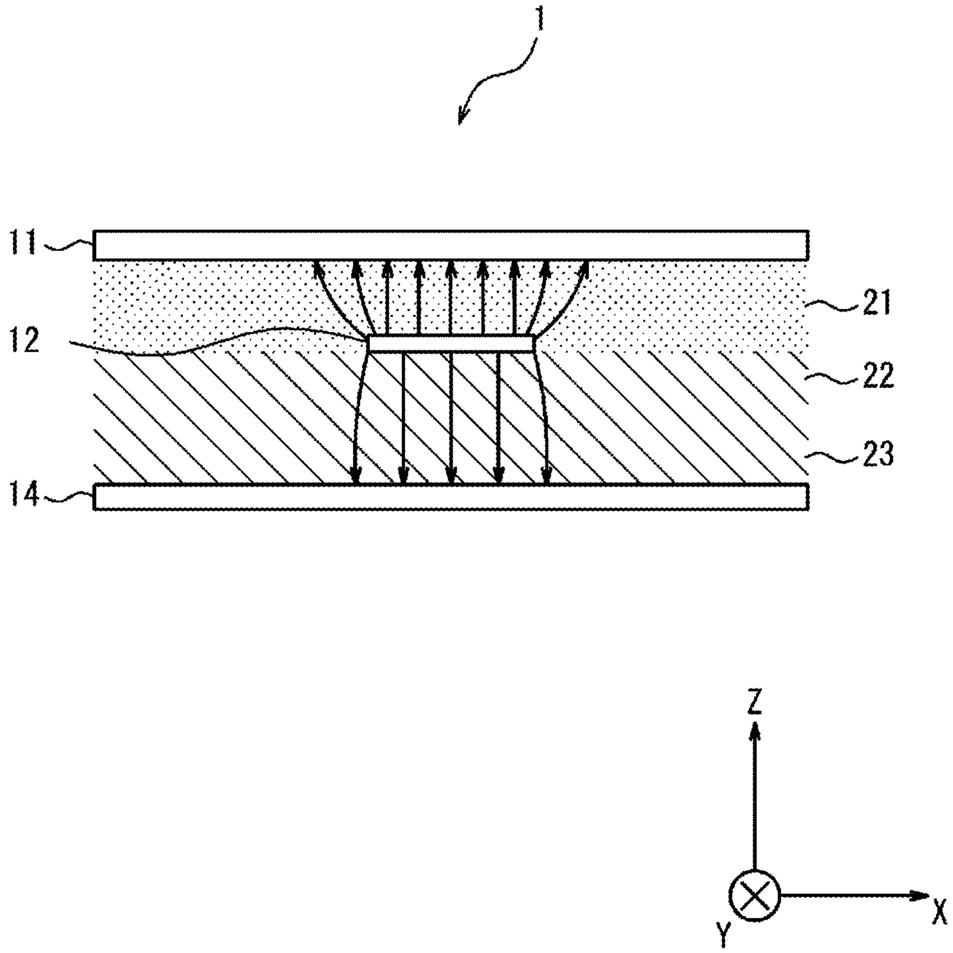
FIG. 3 illustrates a cross section, in a predetermined direction, of the circuit board according to an embodiment.

FIG. 2 illustrates a comparative example for explaining the circuit board 1 according to an embodiment. That is, FIG. 2 illustrates a part of a circuit board 100 as a comparative example for comparison with the circuit board 1 according to an embodiment. FIG. 3 illustrates a part of the circuit board 1 according to an embodiment. In FIGS. 2 and 3, a signal may be transmitted in the Y-axis direction given in the figures.

Each of both the circuit board 100 illustrated in FIG. 2 and the circuit board 1 illustrated in FIG. 3 includes a signal line in an inner layer of the board. The circuit board 100 illustrated in FIG. 2 includes a transmission line 12 between a conductor 11 and a conductor 13. The circuit board 100 illustrated in FIG. 2 further includes a dielectric layer 21 and a dielectric layer 22 between the conductor 11 and the conductor 13. The circuit board 1 illustrated in FIG. 3 includes a transmission line 12 between the conductor 11 and the conductor 14. The circuit board 1 illustrated in FIG. 3 further includes the dielectric layer 21, the dielectric layer 22, and the dielectric layer 23 between the conductor 11 and the conductor 14. As described above, each of both the circuit board 100 illustrated in FIG. 2 and the circuit board 1 illustrated in FIG. 3 includes a strip line. The strip line has a structure in which the transmission line 12 is sandwiched between the conductors and the dielectric layers in the up-down direction (the Z-axis direction). The transmission line 12 serves as the signal line.

In the circuit board 100 illustrated in FIG. 2, the distance between the conductor 11 and the transmission line 12 is larger than the distance between the transmission line 12 and the conductor 13. That is, in the circuit board 100 illustrated in FIG. 2, the dielectric layer 21 has a relatively low permittivity and/or dielectric dissipation factor. The dielectric layer 21 has a thickness (the size in the Z-axis direction given in the figure) larger than the dielectric layer 22 of a prepreg. Here, the permittivity and/or the dielectric dissipation factor of the dielectric layer 22 may be larger than the permittivity and/or the dielectric dissipation factor of the dielectric layer 21. In such a configuration, a large part of the electric field distribution of the signal line (the transmission line 12) enters the conductor 13 closer to a ground plane as FIG. 2 illustrates. That is, in the electric field distribution of the signal line, the dielectric layer 22 having a large permittivity and/or dielectric dissipation factor is dominant.

On the other hand, the conductor 13 is omitted from the circuit board 1 illustrated in FIG. 3 as compared with the structure in FIG. 1. Thus, in the circuit board 1 illustrated in FIG. 3, the distance between the conductor 11 and the transmission line 12 is smaller than the distance between the transmission line 12 and the conductor 14. In such a configuration, a large part of the electric field distribution of the signal line (the transmission line 12) enters the conductor 11 closer to a ground plane as FIG. 3 illustrates. That is, in the electric field distribution of the signal line, the dielectric layer 21 having a small permittivity and/or dielectric dissipation factor is dominant. Thus, the circuit board 1 illustrated in FIG. 3 enables a reduction in the transmission loss of the transmission line 12.

As described above, in an embodiment, the circuit board 1 includes a first conductor 11, a second conductor 14, the transmission line 12, a first dielectric layer 21, and a second dielectric layer (22 and 23). The transmission line 12 may be disposed between the first conductor 11 and the second conductor 14. The first dielectric layer 21 is disposed between the first conductor 11 and the transmission line 12 and may include at least one first dielectric. The second dielectric layer (22 and 23) is disposed between the second conductor 14 and the transmission line 12 and may include at least one second dielectric.

In the circuit board 1 according to an embodiment, the second dielectric layer (22 and 23) is made thicker than the first dielectric layer 21. In the circuit board 1 according to an embodiment, the permittivity and/or the dielectric dissipation factor of the first dielectric in the first dielectric layer 21 is smaller than the permittivity and/or the dielectric dissipation factor of the second dielectric in the second dielectric layer (22 and 23).

In an embodiment, the circuit board 1 enables a reduction in the transmission loss of the transmission line 12. The circuit board 1 also enables a reduction in the amount of the use of a dielectric having a low permittivity and/or dielectric dissipation factor, which is relatively expensive. Thus, in an embodiment, the circuit board 1 can be provided as a circuit board enabling a reduction in loss while manufactured at a cost kept low.

In the circuit board 1 according to an embodiment, the dielectric layers layered in the up-down direction (the Z-axis direction given in the figures) may be made of the same kind of material so as to more favorably direct electrolysis to a dielectric having a small permittivity and/or dielectric dissipation factor. That is, in the circuit board 1 according to an embodiment, the first dielectric of the first dielectric layer 21 and the second dielectric of the second dielectric layer (22 and 23) may be made of the same kind of material.

Figure 4:
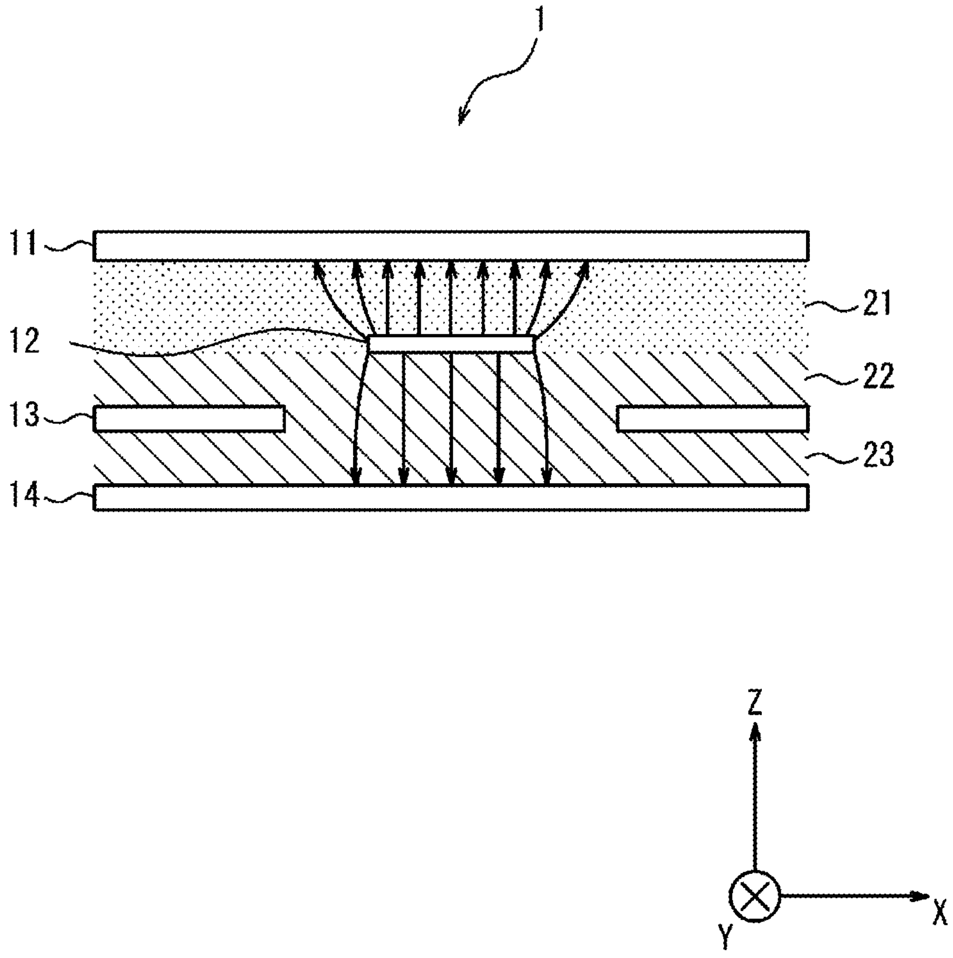
FIG. 4 illustrates a cross section, in a predetermined direction, of the circuit board according to an embodiment.

The structure of the circuit board 1 illustrated in FIG. 3, from which the conductor 13 is omitted, has been described as compared with the structure in FIG. 1. In FIG. 3, an example in which the conductor 13 is completely omitted has been described. On the other hand, in an embodiment, the circuit board 1 may have a structure in which a part of the conductor 13 is omitted as compared with the structure in FIG. 1. For example, as in the circuit board 1 illustrated in FIG. 4, only a part of the conductor 13 existing immediately below (the negative direction of the Z axis given in the figure) the signal line (the transmission line 12) may be removed. As described above, the other parts of the conductor 13 existing in the regions other than the region immediately below (the negative direction of the Z axis given in the figure) the signal line (the transmission line 12) may serve as, for example, a ground plane. In an embodiment, as FIG. 4 illustrates, a part of the conductor 13 existing in a small region adjacent to the region immediately below the transmission line 12 (the negative direction of the Z axis given in the figure) may be further removed.

Hereinafter, the effects of the circuit board 1 in an embodiment will be further described.

For example, as in Patent Literature 1 described above, reducing an effective permittivity by physically providing an air space in an insulating layer between a conductor and a power supply layer can be considered. The permittivity of air (or vacuum) is 1, and air can thus be an ideal insulating layer. However, a special manufacturing process is required to form an air space as in Patent Literature 1. Thus, such a structure may increase the cost. The insulating layer has a very thin structure; thus, forming an air space with high accuracy may be difficult.

When a recessed part is formed to reduce a permittivity as in Patent Literature 2 described above, a special manufacturing process is also required, which may lead to an increase in cost.

For example, in a structure in which dielectric layers sandwich, from above and below, a signal layer (a so-called strip line), the replacement of the upper and lower layers with a material having a low permittivity, particularly a low dielectric dissipation factor, increases the material cost. Accordingly, the manufacturing cost of such a circuit board tends to increase. Thus, for example, replacing only one side with a material having a low permittivity, particularly a low dielectric dissipation factor, can be considered. In Patent Literature 4 described above, in a signal layer sandwiched between insulating layers (that is, a strip line is formed), a low-loss dielectric is used for the thin insulating layer side to concentrate an electric field generated by a signal onto the low-loss dielectric side. With the printed wiring board disclosed in Patent Literature 4 described above, loss reduction can be expected, and an increase in cost can be suppressed to some extent by using an expensive low-loss dielectric only for one side. However, the configuration using such a low-loss dielectric is adopted only when the thickness of the layer of the low permittivity material is made small.

With the circuit board 1 according to an embodiment, such problems, which are mentioned in the above description of the patent literatures, can be overcome.

That is, in the circuit board 1 according to an embodiment, a large part of the radiated electric field from the signal line enters the conductor positioned close to the signal line. Thus, in the circuit board 1 according to an embodiment, the permittivity and/or the dielectric dissipation factor of the dielectric between the signal line and the conductor positioned close to the signal line is made relatively small, and the permittivity and/or the dielectric dissipation factor can thereby be equivalently reduced. Thus, with the circuit board 1 according to an embodiment, the loss (dielectric loss) can be kept low.

In most instances, a material having a low permittivity and/or dielectric dissipation factor may be a cause of cost increase. However, in the circuit board 1 according to an embodiment, a material having a low permittivity and/or dielectric dissipation factor is mounted only on one side. Thus, in an embodiment, the circuit board 1 enables suppression of an increase in material cost. According to the circuit board 1 of an embodiment, even when a layer on the side where the permittivity and/or the dielectric dissipation factor is low is thick, the loss (dielectric loss) can be kept low only by changing a pattern without changing the thickness of the layer. That is, in an embodiment, the circuit board 1 can be manufactured through an existing process, without being subjected to a special manufacturing process. Thus, the circuit board 1 enables suppression of an increase in manufacturing cost.

Each embodiment above has been described as the invention of the circuit board 1. However, the present invention is not limited to such an implementation and may be implemented as inventions of various methods performed by adopting such a circuit board.

REFERENCE SIGNS

1 circuit board
11 to 18 conductor
11 first conductor
13 third conductor
14 second conductor
12 transmission line
21 to 27 dielectric layer
21 first dielectric layer
22 and 23 second dielectric layer

The invention claimed is:

1. A circuit board, comprising:
a first conductor;
a second conductor;
a transmission line disposed between the first conductor and the second conductor;
a first dielectric layer disposed between the first conductor and the transmission line, the first dielectric layer comprising at least one first dielectric; and
a second dielectric layer disposed between the second conductor and the transmission line, the second dielectric layer comprising at least one second dielectric, wherein
the second dielectric layer is thicker than the first dielectric layer,
a permittivity of the first dielectric is smaller than a permittivity of the second dielectric and/or a dielectric dissipation factor of the first dielectric is smaller than a dielectric dissipation factor of the second dielectric, and the second dielectric layer comprises a third conductor different from the first conductor and the second conductor, at a position not overlapping the transmission line in a thickness direction of the circuit board.

2. The circuit board of claim 1, wherein the first dielectric layer is in direct contact with the second dielectric layer.

3. The circuit board of claim 1, wherein the second dielectric layer comprises two layers of the at least one second dielectric separated by the third conductor.

* * * * *